United States Patent
Takazawa et al.

(10) Patent No.: US 9,978,723 B2
(45) Date of Patent: May 22, 2018

(54) SEMICONDUCTOR DEVICE

(71) Applicant: OLYMPUS CORPORATION, Hachioji-shi, Tokyo (JP)

(72) Inventors: Naohiro Takazawa, Tokyo (JP); Yoshitaka Tadaki, Hanno (JP)

(73) Assignee: OLYMPUS CORPORATION, Tokyo (JP)

( * ) Notice: Subject to any disclaimer, the term of this patent is extended or adjusted under 35 U.S.C. 154(b) by 0 days. days.

(21) Appl. No.: 15/643,711

(22) Filed: Jul. 7, 2017

(65) Prior Publication Data

US 2017/0309599 A1    Oct. 26, 2017

Related U.S. Application Data

(63) Continuation of application No. PCT/JP2015/053072, filed on Feb. 4, 2015.

(51) Int. Cl.
*H01L 25/00* (2006.01)
*H01L 25/065* (2006.01)
(Continued)

(52) U.S. Cl.
CPC ........ *H01L 25/0657* (2013.01); *H01L 23/528* (2013.01); *H01L 24/05* (2013.01);
(Continued)

(58) Field of Classification Search
CPC .............. H01L 21/8221; H01L 25/043; H01L 2021/6009; H01L 24/14
(Continued)

(56) References Cited

U.S. PATENT DOCUMENTS 4,764,804 A * 8/1988 Sahara .................... H01L 23/24
                                                                        174/16.3
6,724,084 B1 * 4/2004 Hikita ............... H01L 23/49575
                                                                        257/737
(Continued)

FOREIGN PATENT DOCUMENTS

| JP | 2005-310837 A | 11/2005 |
|----|---------------|---------|
| JP | 2006-60262 A  | 3/2006  |
| JP | 2013-211380 A | 10/2013 |
| JP | 2014-72487 A  | 4/2014  |

OTHER PUBLICATIONS

International Search Report dated May 12, 2015, issued in counterpart International Application No. PCT/JP2015/053072 (1 page).

*Primary Examiner* — George Fourson, III

(74) *Attorney, Agent, or Firm* — Westerman, Hattori, Daniels & Adrian, LLP

(57) ABSTRACT

A semiconductor device includes a first semiconductor substrate, a second semiconductor substrate, a bonding electrode, and a dummy electrode. The first semiconductor substrate has a first surface and a first wiring, and contains a first semiconductor material. The second semiconductor substrate has a second surface and a second wiring, and contains a second semiconductor material, and the first surface and the second surface face each other. The bonding electrode is arranged between the first surface and the second surface, and is electrically connected to the first wiring and the second wiring. The dummy electrode is arranged between the first surface and the second surface, and is electrically insulated from at least one of the first wiring and the second wiring. The bonding electrode has a bonding bump and a first bonding pad. The dummy electrode has a dummy bump and a first dummy pad.

4 Claims, 8 Drawing Sheets

(51) Int. Cl.
*H01L 23/528* (2006.01)
*H01L 23/00* (2006.01)
*H01L 21/60* (2006.01)
*H01L 25/04* (2014.01)
*H01L 21/822* (2006.01)

(52) U.S. Cl.
CPC .............. *H01L 24/06* (2013.01); *H01L 24/16* (2013.01); *H01L 24/17* (2013.01); *H01L 21/8221* (2013.01); *H01L 24/14* (2013.01); *H01L 25/043* (2013.01); *H01L 2021/6009* (2013.01); *H01L 2224/05082* (2013.01); *H01L 2224/05124* (2013.01); *H01L 2224/05144* (2013.01); *H01L 2224/05147* (2013.01); *H01L 2224/05554* (2013.01); *H01L 2224/0603* (2013.01); *H01L 2224/06515* (2013.01); *H01L 2224/13014* (2013.01); *H01L 2224/13124* (2013.01); *H01L 2224/13144* (2013.01); *H01L 2224/13147* (2013.01); *H01L 2224/16013* (2013.01); *H01L 2224/16104* (2013.01); *H01L 2224/16113* (2013.01); *H01L 2224/16145* (2013.01); *H01L 2224/17517* (2013.01); *H01L 2225/06513* (2013.01)

(58) Field of Classification Search
USPC ........................................................ 257/777
See application file for complete search history.

(56) References Cited

U.S. PATENT DOCUMENTS

| | | | |
|---|---|---|---|
| 2003/0057537 A1* | 3/2003 | Iwasaki | H01L 23/16 257/684 |
| 2004/0004292 A1* | 1/2004 | Hsieh | H01L 21/563 257/778 |
| 2005/0230824 A1 | 10/2005 | Watanabe et al. | |
| 2006/0231949 A1* | 10/2006 | Park | H01L 23/49811 257/737 |
| 2008/0150133 A1* | 6/2008 | Nakamura | H01L 24/17 257/737 |
| 2009/0140422 A1* | 6/2009 | Park | H05K 1/111 257/737 |
| 2012/0049351 A1* | 3/2012 | Lee | H01L 23/49838 257/737 |
| 2012/0313236 A1* | 12/2012 | Wakiyama | H01L 23/544 257/734 |
| 2013/0043583 A1* | 2/2013 | Wu | H01L 23/3171 257/737 |
| 2013/0127048 A1* | 5/2013 | Hasegawa | H01L 23/3128 257/737 |
| 2013/0256876 A1* | 10/2013 | Lee | H01L 24/14 257/737 |
| 2013/0313690 A1* | 11/2013 | Miyazaki | H01L 23/481 257/621 |
| 2014/0061897 A1* | 3/2014 | Lin | H01L 24/06 257/737 |
| 2014/0167254 A1* | 6/2014 | Yu | H01L 24/13 257/737 |

* cited by examiner

SEMICONDUCTOR DEVICE

BACKGROUND OF THE INVENTION

Field of the Invention

The present invention relates to a semiconductor device. This application is a continuation application based on PCT Application No. PCT/JP2015/053072, filed Feb. 4, 2015, the content of which is incorporated herein.

Description of Related Art

A semiconductor device having a plurality of substrates, wherein the plurality of substrates are electrically connected, has been disclosed. In this semiconductor device, the plurality of substrates are connected by electrodes arranged between the plurality of substrates. The substrate may be deformed in a region where an electrode density is low due to a load applied when the plurality of substrates are bonded. That is, the substrate may be bent.

Japanese Unexamined Patent Application, First Publication No. 2014-72487 discloses a structure for suppressing deformation of a substrate during bonding. FIG. 9 shows a configuration of a semiconductor device 1000a having a structure similar to the structure disclosed in Japanese Unexamined Patent Application, First Publication No. 2014-72487.

In FIG. 9, a cross section of the semiconductor device 1000a is shown. As shown in FIG. 9, the semiconductor device 1000a includes a first substrate 60, a second substrate 70, a bonding electrode 80, and a dummy electrode 90. The first substrate 60 and the second substrate 70 are stacked via the bonding electrode 80 and the dummy electrode 90 therebetween.

The bonding electrode 80 and the dummy electrode 90 are arranged between the first substrate 60 and the second substrate 70. The bonding electrode 80 is electrically connected to the first substrate 60 and the second substrate 70. The dummy electrode 90 is electrically insulated from the first substrate 60 and the second substrate 70. The thickness (height) of the bonding electrode 80 is the same as the thickness (height) of the dummy electrode 90.

The bonding electrode 80 has bonding metal 800, a first bump 801, and a second bump 802. The first bump 801 is in contact with the second substrate 70. The second bump 802 is in contact with the first substrate 60. The bonding metal 800 is in contact with the first bump 801 and the second bump 802.

In the semiconductor device 1000a shown in FIG. 9, the bonding electrode 80 and the dummy electrode 90 are subjected to a load when the first substrate 60 and the second substrate 70 are bonded. Because the dummy electrode 90 is arranged in a region where the density of the bonding electrode 80 is low, the first substrate 60 and the second substrate 70 are supported by the bonding electrode 80 and the dummy electrode 90. Therefore, deformation of the first substrate 60 and the second substrate 70 is suppressed. However, because the load is dispersed in the bonding electrode 80 and the dummy electrode 90, a sufficient load may not be applied to the bonding electrode 80.

In order for the bonding electrode 80 to be sufficiently connected to the first substrate 60 and the second substrate 70, it is necessary to increase the load. However, there is a limit on the improvement of performance when a bonding device generates a load.

Japanese Unexamined Patent Application, First Publication No. 2014-72487 discloses a structure for suppressing an increase in the load at the time of bonding and suppressing deformation of the substrate. FIG. 10 shows a configuration of a semiconductor device 1000b having a structure similar to the structure disclosed in Japanese Unexamined Patent Application, First Publication No. 2014-72487.

In FIG. 10, a cross section of the semiconductor device 1000b is shown. As shown in FIG. 10, the semiconductor device 1000b includes a first substrate 60, a second substrate 70, a bonding electrode 80, and a dummy electrode 91. The first substrate 60 and the second substrate 70 are stacked via the bonding electrode 80 and the dummy electrode 91 therebetween.

The bonding electrode 80 and the dummy electrode 91 are arranged between the first substrate 60 and the second substrate 70. The bonding electrode 80 is the same as the bonding electrode 80 shown in FIG. 9. The dummy electrode 91 is electrically insulated from the first substrate 60 and the second substrate 70. The thickness (height) of the bonding electrode 80 is the same as the thickness (height) of the dummy electrode 91.

The shape of the dummy electrode 91 is different from the shape of the dummy electrode 90. The width of an upper part 91a of the dummy electrode 91 is smaller than the width of a lower part 91b of the dummy electrode 91. That is, the upper part 91a of the dummy electrode 91 is thinner than the lower part 91b of the dummy electrode 91. An area S21 of a surface where the upper part 91a of the dummy electrode 91 is in contact with the first substrate 60 is smaller than an area S20 of a surface where the dummy electrode 90 is in contact with the first substrate 60.

In the semiconductor device 1000b shown in FIG. 10, the bonding electrode 80 and the dummy electrode 91 are subjected to a load when the first substrate 60 and the second substrate 70 are bonded. Because the dummy electrode 91 is arranged in a region where the density of the bonding electrode 80 is low, the first substrate 60 and the second substrate 70 are supported by the bonding electrode 80 and the dummy electrode 91. Therefore, deformation of the first substrate 60 and the second substrate 70 is suppressed. Also, because the upper part 91a of the dummy electrode 91 is thin, more load is likely to be applied to the bonding electrode 80. Thus, an increase in the load necessary for bonding is suppressed.

SUMMARY OF THE INVENTION

According to a first aspect of the present invention, a semiconductor device includes a first semiconductor substrate, a second semiconductor substrate, a bonding electrode, and a dummy electrode. The first semiconductor substrate has a first surface and a first wiring and contains a first semiconductor material. The second semiconductor substrate has a second surface and a second wiring and contains a second semiconductor material. The first surface and the second surface face each other. The bonding electrode is arranged between the first surface and the second surface and electrically connected to the first wiring and the second wiring. The dummy electrode is arranged between the first surface and the second surface and electrically insulated from at least one of the first wiring and the second wiring. The bonding electrode includes a bonding bump and a first bonding pad. The first boding pad has a third surface and a fourth surface. The third surface is in contact with one of the first surface and the second surface and the fourth surface is in contact with the bonding bump. The dummy electrode includes a dummy bump and a first dummy pad. The first dummy pad has a fifth surface and a sixth surface. The fifth surface is in contact with one of the first surface and the second surface. The thickness of the dummy bump is the same as the thickness of the bonding bump. One of a first condition and a second condition is satisfied. The sixth surface is in contact with the dummy bump under the first condition. The area of the fifth surface is smaller than the area of the third surface under the first condition. The thickness of the first dummy pad is the same as the thickness of the first bonding pad under the first condition. The thickness of the first dummy pad is smaller than the thickness of the first bonding pad under the second condition.

According to a second aspect of the present invention, in the first aspect, the bonding electrode may further include a second bonding pad. The second bonding pad may have a seventh surface and an eighth surface. The seventh surface may be in contact with the first surface or the second surface which is not in contact with the third surface, and the eighth surface may be in contact with the bonding bump. The dummy electrode may further include a second dummy pad. The second dummy pad may have a ninth surface and a tenth surface. The ninth surface may be in contact with the first surface or the second surface which is not in contact with the fifth surface, and the tenth surface may be in contact with the dummy bump. The thickness of the second dummy pad may be the same as the thickness of the second bonding pad. The first condition may be satisfied.

According to a third aspect of the present invention, in the first aspect, the first bonding pad may include a first barrier layer and a first bonding layer. The first barrier layer may have the third surface. The third surface may be in contact with one of the first surface and the second surface. The first bonding layer may be stacked on the first barrier layer and have the fourth surface. The fourth surface may be in contact with the bonding bump. The thickness of the first dummy pad may be the same as the thickness of the first barrier layer. The second condition may be satisfied.

According to a fourth aspect of the present invention, in the third aspect, the bonding electrode may further include a second bonding pad. The second bonding pad may include a second barrier layer and a second bonding layer. The second barrier layer may have a seventh surface. The seventh surface may be in contact with the first surface or the second surface which is not in contact with the third surface. The second bonding layer may be stacked on the second barrier layer and may have an eighth surface. The eighth surface may be in contact with the bonding bump. The dummy electrode may further include a second dummy pad. The second dummy pad may include a dummy barrier layer and a dummy bonding layer. The dummy barrier layer may have a ninth surface. The ninth surface may be in contact with the first surface or the second surface which is not in contact with the fifth surface. The dummy bonding layer may be stacked on the dummy barrier layer and may have a tenth surface. The tenth surface may be in contact with the dummy bump. The thickness of the dummy barrier layer may be the same as the thickness of the second barrier layer. The thickness of the dummy bonding layer may be the same as the thickness of the second bonding layer.

DETAILED DESCRIPTION OF THE INVENTION

Embodiments of the present invention will be described with reference to the drawings.

First Embodiment

Figure 1:
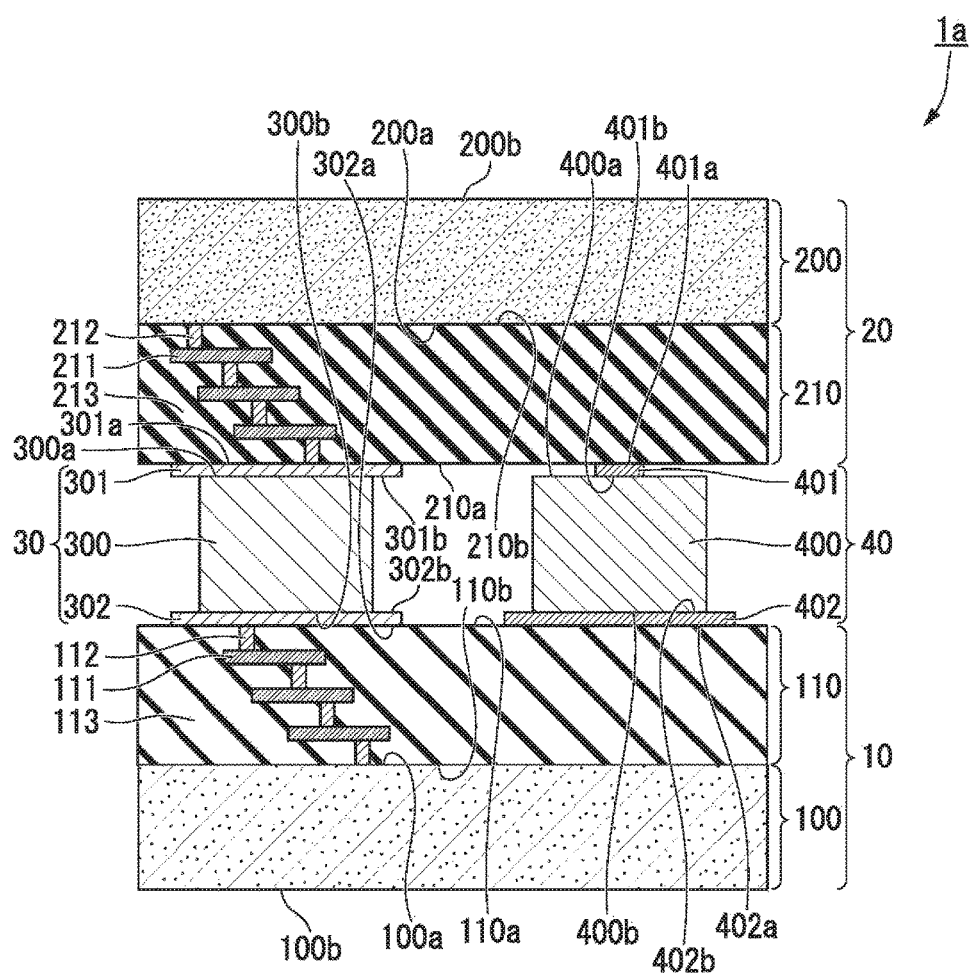
FIG. 1 is a cross-sectional view of a semiconductor device according to a first embodiment of the present invention.

FIG. 1 shows a configuration of a semiconductor device 1a according to the first embodiment of the present invention. In FIG. 1, a cross section of the semiconductor device 1a is shown. As shown in FIG. 1, the semiconductor device 1a includes a first substrate 10 (a first semiconductor substrate), a second substrate 20 (a second semiconductor substrate), a bonding electrode 30, and a dummy electrode 40. The first substrate 10 and the second substrate 20 are stacked via the bonding electrode 30 and the dummy electrode 40 therebetween.

Dimensions of parts constituting the semiconductor device 1a are not subject to being dimensions shown in FIG. 1. The dimensions of the parts constituting the semiconductor device 1a are arbitrary. In FIG. 1, the thickness of the part constituting the semiconductor device 1a is indicated as a length of the part in a vertical direction. In FIG. 1, the area of the part constituting the semiconductor device 1a is based on the length of the part in a horizontal direction.

The first substrate 10 includes a first semiconductor layer 100 and a first wiring layer 110. The first semiconductor layer 100 and the first wiring layer 110 overlap in a direction crossing a main surface of the first substrate 10 (the widest surface among a plurality of surfaces constituting a surface of the substrate) (for example, a direction substantially perpendicular to the main surface). Also, the first semiconductor layer 100 and the first wiring layer 110 are in contact with each other.

The first semiconductor layer 100 is made of a first semiconductor material. That is, the first substrate 10 includes the first semiconductor material. For example, the first semiconductor material is silicon (Si). The first semiconductor layer 100 has a surface 100a and a surface 100b. The surface 100a and the surface 100b face in opposite directions. The surface 100a is in contact with the first wiring layer 110. The surface 100b constitutes one of main surfaces of the first substrate 10.

The first wiring layer 110 includes first wiring 111, a first via 112, and a first interlayer insulating film 113. Although a plurality of first wirings 111 exist in FIG. 1, the reference numeral of one first wiring 111 is shown as a representative.

Although a plurality of first vias 112 exist in FIG. 1, the reference numeral of one first via 112 is shown as a representative.

The first wiring layer 110 has a surface 110a and a surface 110b. The surface 110a faces the second substrate 20. The surface 110a is in contact with the bonding electrode 30 and the dummy electrode 40. The surface 110b is in contact with the first semiconductor layer 100. The surface 110a constitutes one of the main surfaces of the first substrate 10.

The first wiring 111 and the first via 112 are made of conductive materials. For example, the conductive materials constituting the first wiring 111 and the first via 112 are metals such as aluminum (Al) and copper (Cu). The first wiring 111 is a thin film on which a wiring pattern is formed. The first wiring 111 transmits a signal. The first wiring 111 having only one layer may be formed or the first wiring 111 having a plurality of layers may be formed. In the example shown in FIG. 1, the first wiring 111 having three layers is formed.

The first via 112 connects first wirings 111 of different layers. In the first wiring layer 110, parts other than the first wiring 111 and the first via 112 are formed of the first interlayer insulating film 113. The first interlayer insulating film 113 is made of silicon dioxide ($SiO_2$) or the like.

At least one of the first semiconductor layer 100 and the first wiring layer 110 may include a circuit element such as a transistor.

The second substrate 20 includes a second semiconductor layer 200 and a second wiring layer 210. The second semiconductor layer 200 and the second wiring layer 210 overlap in a direction crossing the main surface of the second substrate 20 (for example, a direction substantially perpendicular to the main surface). Also, the second semiconductor layer 200 and the second wiring layer 210 are in contact with each other.

The second semiconductor layer 200 is made of a second semiconductor material. That is, the second substrate 20 includes the second semiconductor material. For example, the second semiconductor material is silicon (Si). The second semiconductor layer 200 has a surface 200a and a surface 200b. The surface 200a and the surface 200b face in opposite directions. The surface 200a is in contact with the second wiring layer 210. The surface 200b constitutes one of main surfaces of the second substrate 20.

The second wiring layer 210 includes second wiring 211, a second via 212, and a second interlayer insulating film 213. Although a plurality of second wirings 211 exist in FIG. 1, the reference numeral of one second wiring 211 is shown as a representative. Although a plurality of second vias 212 exist in FIG. 1, the reference numeral of one second via 212 is shown as a representative.

The second wiring layer 210 has a surface 210a and a surface 210b. The surface 210a faces the first substrate 10. The surface 210a is in contact with the bonding electrode 30 and the dummy electrode 40. The surface 210b is in contact with the second semiconductor layer 200. The surface 210a constitutes one of the main surfaces of the second substrate 20.

The second wiring 211 and the second via 212 are made of conductive materials. For example, the conductive materials constituting the second wiring 211 and the second via 212 are metals such as aluminum (Al) and copper (Cu). The second wiring 211 is a thin film on which a wiring pattern is formed. The second wiring 211 transmits a signal. The second wiring 211 having only one layer may be formed or the second wiring 211 having a plurality of layers may be formed. In the example shown in FIG. 1, the second wiring 211 having three layers is formed.

The second via 212 connects second wirings 211 of different layers. In the second wiring layer 210, parts other than the second wiring 211 and the second via 212 are constituted of the second interlayer insulating film 213. The second interlayer insulating film 213 is made of silicon dioxide ($SiO_2$) or the like.

At least one of the second semiconductor layer 200 and the second wiring layer 210 may have a circuit element such as a transistor.

As described above, the first substrate 10 has the surface 110a (the first surface) and the first wiring 111 and includes a first semiconductor material. The second substrate 20 has the surface 210a (the second surface) and the second wiring 211 and includes a second semiconductor material. The surface 110a and the surface 210a face each other.

The bonding electrode 30 is arranged between the surface 110a (the first surface) and the surface 210a (the second surface). The bonding electrode 30 is electrically connected to the first wiring 111 and the second wiring 211. The dummy electrode 40 is arranged between the surface 110a and the surface 210a. The dummy electrode 40 is electrically insulated from at least one of the first wiring 111 and the second wiring 211.

The bonding electrode 30 has a bonding bump 300 and a first bonding pad 301. The bonding bump 300 and the first bonding pad 301 are made of conductive materials. For example, the conductive materials constituting the bonding bump 300 and the first bonding pad 301 are metals such as gold (Au), aluminum (Al), and copper (Cu). The first bonding pad 301 has a surface 301a (a third surface) and a surface 301b (a fourth surface). The surface 301a and the surface 301b face in opposite directions. The surface 301a is in contact with one of the surface 110a (the first surface) and the surface 210a (the second surface). In FIG. 1, the surface 301a is in contact with the surface 210a. The surface 301b is in contact with the bonding bump 300.

The dummy electrode 40 has a dummy bump 400 and a first dummy pad 401. The dummy bump 400 and the first dummy pad 401 are made of conductive materials. For example, the conductive materials constituting the dummy bump 400 and the first dummy pad 401 are metals such as gold (Au), aluminum (Al), and copper (Cu). The first dummy pad 401 has a surface 401a (a fifth surface) and a surface 401b (a sixth surface). The surface 401a and the surface 401b face in opposite directions. The surface 401a is in contact with one of the surface 110a (the first surface) and the surface 210a (the second surface). In FIG. 1, the surface 401a is in contact with the surface 210a.

The thickness of the dummy bump 400 is the same as the thickness of the bonding bump 300. In the first embodiment, a first condition is satisfied. Under the first condition, the surface 401b (the sixth surface) is in contact with the dummy bump 400. Under the first condition, the area of the surface 401a (the fifth surface) is smaller than the area of the surface 301a (the third surface). Under the first condition, the thickness of the first dummy pad 401 is the same as the thickness of the first bonding pad 301.

Because the area of the surface 401a is smaller than the area of the surface 301a, the area of the first dummy pad 401 projected onto the surface 210a is smaller than the area of the first bonding pad 301 projected onto the surface 210a. The cross-sectional area of the first dummy pad 401 in a plane parallel to the surface 210a is smaller than the cross-sectional area of the first bonding pad 301 in the plane parallel to the surface 210a.

The bonding electrode 30 further has a second bonding pad 302. The second bonding pad 302 is made of a conductive material. For example, conductive materials constituting the second bonding pad 302 are metals such as gold (Au), aluminum (Al), and copper (Cu). The second bonding pad 302 has a surface 302a (a seventh surface) and a surface 302b (an eighth surface). The surface 302a is in contact with the surface 110a (the first surface) or the surface 210a (the second surface) which is not in contact with the surface 301a (the third surface). In FIG. 1, the surface 302a is in contact with the surface 110a. The surface 302b is in contact with the bonding bump 300.

The dummy electrode 40 further has a second dummy pad 402. The second dummy pad 402 is made of a conductive material. For example, conductive materials constituting the second dummy pad 402 are metals such as gold (Au), aluminum (Al), and copper (Cu). The second dummy pad 402 has a surface 402a (a ninth surface) and a surface 402b (a tenth surface). The surface 402a is in contact with the surface 110a (the first surface) or the surface 210a (the second surface) which is not in contact with the surface 401a (the fifth surface). In FIG. 1, the surface 402a is in contact with the surface 110a. The surface 402b is in contact with the dummy bump 400. The thickness of the second dummy pad 402 is the same as the thickness of the second bonding pad 302.

Because the first dummy pad 401 is arranged, it is difficult for the metal constituting the dummy bump 400 to diffuse into the second wiring layer 210 at the time of bonding. Likewise, because the second dummy pad 402 is arranged, it is difficult for the metal constituting the dummy bump 400 to diffuse into the first wiring layer 110 at the time of bonding. Therefore, a change in electrical characteristics of the semiconductor device 1a due to the diffusion of the metal constituting the dummy bump 400 into the first wiring layer 110 or the second wiring layer 210 at the time of bonding is suppressed.

The bonding bump 300 has a surface 300a and a surface 300b. The surface 300a and the surface 300b face in opposite directions. The surface 301b is in contact with the surface 300a. The surface 302b is in contact with the surface 300b. The area of the surface 300a is the same as the area of the surface 300b. The area of the surface 301a and the area of the surface 301b are larger than the area of the surface 300a. The area of the surface 302a and the area of the surface 302b are larger than the area of the surface 300b.

The dummy bump 400 has a surface 400a and a surface 400b. The surface 400a and the surface 400b face in opposite directions. The surface 401b is in contact with the surface 400a. The surface 402b is in contact with the surface 400b. The area of the surface 400a is the same as the area of the surface 400b. The areas of the surface 401a and the surface 401b are smaller than the area of the surface 400a. The areas of the surface 402a and the surface 402b are larger than the area of the surface 400b.

The thickness of the bonding bump 300 is the distance between the surface 300a and the surface 300b. The thickness of the first bonding pad 301 is the distance between the surface 301a and the surface 301b. The thickness of the second bonding pad 302 is the distance between the surface 302a and the surface 302b. The thickness of the dummy bump 400 is the distance between the surface 400a and the surface 400b. The thickness of the first dummy pad 401 is the distance between the surface 401a and the surface 401b. The thickness of the second dummy pad 402 is the distance between the surface 402a and the surface 402b. For example, the thickness of each of the first bonding pad 301, the second bonding pad 302, the first dummy pad 401, and the second dummy pad 402 is smaller than 1 μm.

The sum of the thickness of the bonding bump 300 and the thickness of the first bonding pad 301 is the same as the sum of the thickness of the dummy bump 400 and the thickness of the first dummy pad 401. The sum of the thickness of the bonding bump 300, the thickness of the first bonding pad 301, and the thickness of the second bonding pad 302 is the same as the sum of the thickness of the dummy bump 400, the thickness of the first dummy pad 401, and the thickness of the second dummy pad 402.

The surface 302a is in contact with the first via 112. Thus, the bonding electrode 30 is electrically connected to the first wiring 111. The surface 301a is in contact with the second via 212. Thus, the bonding electrode 30 is electrically connected to the second wiring 211.

The surface 402a is not in contact with the first via 112. Thus, the dummy electrode 40 is electrically insulated from the first wiring 111. The surface 401a is not in contact with the second via 212. Thus, the dummy electrode 40 is electrically insulated from the second wiring 211. The dummy electrode 40 may be electrically connected to only one of the first wiring 111 and the second wiring 211.

The area of the surface 401a may be larger than the area of the surface 400a and the area of the surface 402a may be smaller than the area of the surface 302a.

An insulator such as a resin may be arranged between the first substrate 10 and the second substrate 20 to surround the bonding electrode 30 and the dummy electrode 40.

In the semiconductor device 1a shown in FIG. 1, the bonding electrode 30 and the dummy electrode 40 are subjected to a load when the first substrate 10 and the second substrate 20 are bonded. Thus, the first substrate 10 and the second substrate 20 are supported by the bonding electrode 30 and the dummy electrode 40. Therefore, deformation of the first substrate 10 and the second substrate 20 is suppressed. Also, because the area of the surface 401a is smaller than the area of the surface 301a, more load is likely to be applied to the bonding electrode 30. Thus, an increase in the load necessary for bonding is suppressed.

The bonding electrode 30 and the dummy electrode 40 can be formed in the same process. Therefore, a manufacturing process of the semiconductor device 1a can be simplified. In the manufacturing process of the semiconductor device 1a, the second bonding pad 302 and the second dummy pad 402 are simultaneously formed on the surface 110a through sputtering, vapor deposition, or the like. Thereafter, the bonding bump 300 and the dummy bump 400 are simultaneously formed. On the other hand, the first bonding pad 301 and the first dummy pad 401 are simultaneously formed on the surface 210a through sputtering, vapor deposition, or the like. Thereafter, in the bonding process, the bonding bump 300 and the first bonding pad 301 are connected and the dummy bump 400 and the first dummy pad 401 are connected.

Figure 2:
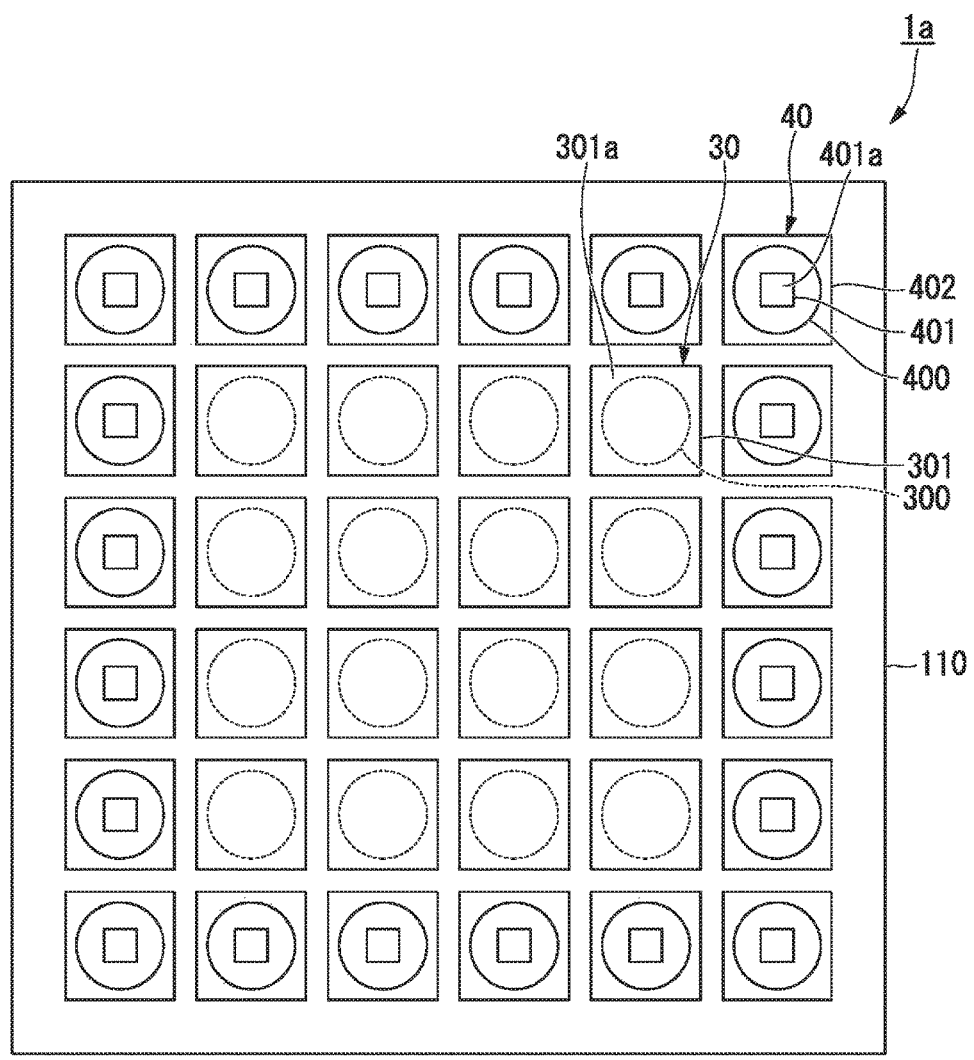
FIG. 2 is a plan view of a semiconductor device according to the first embodiment of the present invention.

FIG. 2 shows an arrangement of the bonding electrode 30 and the dummy electrode 40. In FIG. 2, a state in which the semiconductor device 1a is viewed in a direction perpendicular to the surface 110a is shown. In FIG. 2, the second substrate 20 is omitted. As shown in FIG. 2, the semiconductor device 1a has a plurality of bonding electrodes 30 and a plurality of dummy electrodes 40. In FIG. 2, the reference numerals of one bonding electrode 30 and one dummy electrode 40 are shown as representatives. The plurality of bonding electrodes 30 and the plurality of dummy electrodes 40 are arranged in a matrix. The plurality of dummy electrodes 40 are arranged to surround the plurality of bonding electrodes 30. An array of the plurality of bonding electrodes 30 and the plurality of dummy electrodes 40 is not limited to an array shown in FIG. 2.

In FIG. 2, the surface 301a of the first bonding pad 301 and the surface 401a of the first dummy pad 401 are shown. As shown in FIG. 2, the area of the surface 401a is smaller than the area of the surface 301a.

The shape of the bonding bump 300 is circular. The shape of the first bonding pad 301 is rectangular. Although not shown in FIG. 2, the shape of the second bonding pad 302 is rectangular. The shape of the dummy bump 400 is circular. The shapes of the first dummy pad 401 and the second dummy pad 402 are rectangular. The shape of the bonding bump 300 and the like may be other than the above shapes.

According to the first embodiment, the semiconductor device 1a is configured of the first substrate 10, the second substrate 20, the bonding electrode 30, and the dummy electrode 40.

In the first embodiment, the first substrate 10 and the second substrate 20 are supported by the bonding electrode 30 and the dummy electrode 40 at the time of bonding. Therefore, deformation of the first substrate 10 and the second substrate 20 is suppressed. Further, because the area of the surface 401a is smaller than the area of the surface 301a, an increase in the load necessary for bonding is suppressed. The bonding electrode 30 and the dummy electrode 40 can be formed in the same process. Thus, the manufacturing process of the semiconductor device 1a can be simplified.

Second Embodiment

Figure 3:
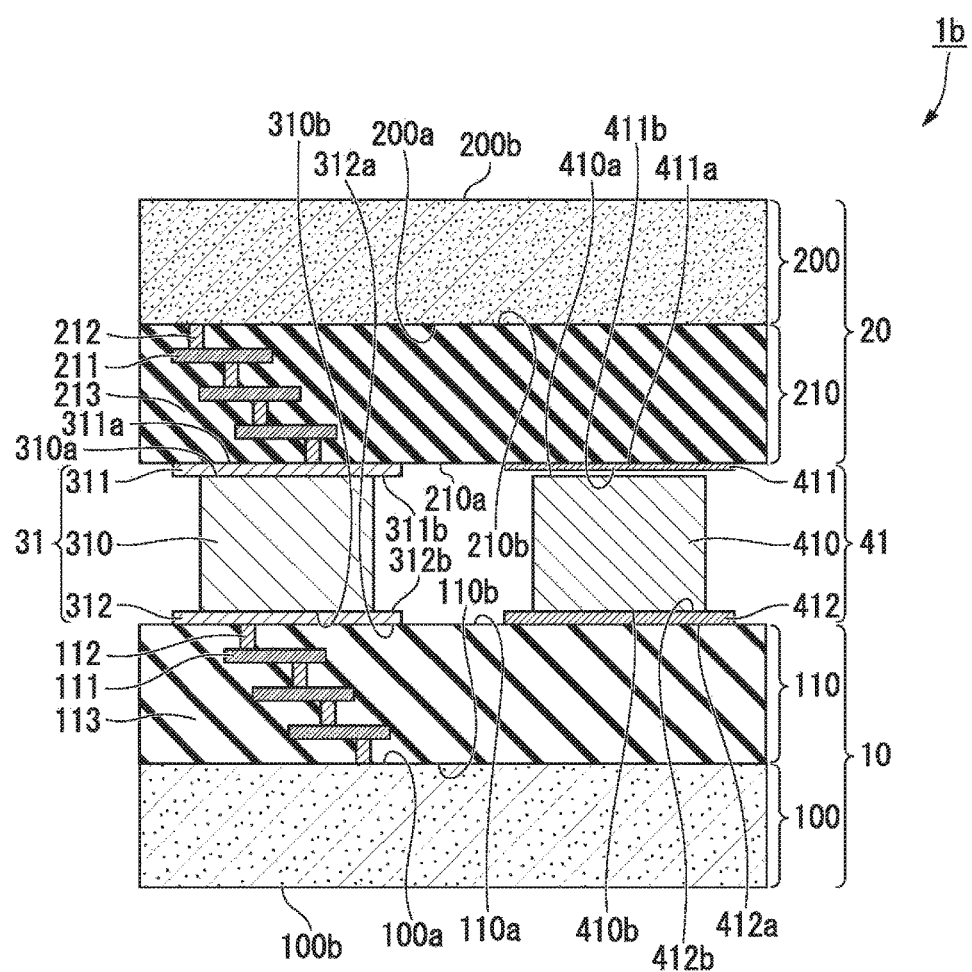
FIG. 3 is a cross-sectional view of a semiconductor device according to a second embodiment of the present invention.

FIG. 3 shows a configuration of a semiconductor device 1b according to a second embodiment of the present invention. In FIG. 3, a cross section of the semiconductor device 1b is shown. As shown in FIG. 3, the semiconductor device 1b includes a first substrate 10, a second substrate 20, a bonding electrode 31, and a dummy electrode 41. The first substrate 10 and the second substrate 20 are stacked via the bonding electrode 31 and the dummy electrode 41.

Dimensions of parts constituting the semiconductor device 1b are not subject to being dimensions shown in FIG. 3. The dimensions of the parts constituting the semiconductor device 1b are arbitrary. In FIG. 3, the thickness of the part constituting the semiconductor device 1b is indicated as the length of the part in a vertical direction.

Differences from the configuration shown in FIG. 1 will be described in terms of the configuration shown in FIG. 3.

In the semiconductor device 1b, the bonding electrode 30 shown in FIG. 1 is changed to the bonding electrode 31. Further, in the semiconductor device 1b, the dummy electrode 40 shown in FIG. 1 is changed to the dummy electrode 41. The bonding electrode 31 is arranged between a surface 110a (a first surface) and a surface 210a (a second surface). The bonding electrode 31 is electrically connected to the first wiring 111 and the second wiring 211. The dummy electrode 41 is arranged between the surface 110a and the surface 210a. The dummy electrode 41 is electrically insulated from at least one of the first wiring 111 and the second wiring 211.

The bonding electrode 31 has a bonding bump 310 and a first bonding pad 311. The bonding bump 310 and the first bonding pad 311 are made of conductive materials. For example, conductive materials constituting the bonding bump 310 are metals such as gold (Au), aluminum (Al), and copper (Cu). A conductive material constituting the first bonding pad 311 will be described below. The first bonding pad 311 has a surface 311a (a third surface) and a surface 311b (a fourth surface). The surfaces 311a and 311b face in opposite directions. The surface 311a is in contact with one of the surface 110a (the first surface) and the surface 210a (the second surface). In FIG. 3, the surface 311a is in contact with the surface 210a. The surface 311b is in contact with the bonding bump 310.

The dummy electrode 41 has a dummy bump 410 and a first dummy pad 411. The dummy bump 410 and the first dummy pad 411 are made of conductive materials. For example, the conductive materials constituting the dummy bump 410 are metals such as gold (Au), aluminum (Al), and copper (Cu). A conductive material constituting the first dummy pad 411 will be described below. The first dummy pad 411 has a surface 411a (a fifth surface) and a surface 411b (a sixth surface). The surfaces 411a and 411b face in opposite directions. The surface 411a is in contact with one of the surface 110a (the first surface) and the surface 210a (the second surface). In FIG. 3, the surface 411a is in contact with the surface 210a.

The thickness of the dummy bump 410 is the same as the thickness of the bonding bump 310. In the second embodiment, a second condition is satisfied. Under the second condition, the thickness of the first dummy pad 411 is smaller than the thickness of the first bonding pad 311.

The bonding electrode 31 further has a second bonding pad 312. The second bonding pad 312 is made of a conductive material. The conductive material constituting the second bonding pad 312 will be described below. The second bonding pad 312 has a surface 312a (a seventh surface) and a surface 312b (an eighth surface). The surface 312a is in contact with the surface 110a (the first surface) or the surface 210a (the second surface) which is not in contact with the surface 311a (the third surface). In FIG. 3, the surface 312a is in contact with the surface 110a. The surface 312b is in contact with the bonding bump 310.

The dummy electrode 41 further has a second dummy pad 412. The second dummy pad 412 is made of a conductive material. The conductive material constituting the second dummy pad 412 will be described below. The second dummy pad 412 has a surface 412a (a ninth surface) and a surface 412b (a tenth surface). The surface 412a is in contact with the surface 110a or the surface 210a which is not in contact with the surface 411a. In FIG. 3, the surface 412a is in contact with the surface 110a. The surface 412b is in contact with the dummy bump 410. The thickness of the second dummy pad 412 is the same as the thickness of the second bonding pad 312.

Because the first dummy pad 411 is arranged, it is difficult for the metal constituting the dummy bump 410 to diffuse into the second wiring layer 210 at the time of bonding. Likewise, because the second dummy pad 412 is arranged, it is difficult for the metal constituting the dummy bump 410 to diffuse into the first wiring layer 110 at the time of bonding. Therefore, a change in electrical characteristics of the semiconductor device 1b due to the diffusion of the metal constituting the dummy bump 410 into the first wiring layer 110 or the second wiring layer 210 at the time of bonding is suppressed.

The bonding bump 310 has a surface 310a and a surface 310b. The surfaces 310a and 310b face in opposite directions. The surface 311b is in contact with the surface 310a. The surface 312b is in contact with the surface 310b.

The dummy bump 410 has a surface 410a and a surface 410b. The surface 410a and the surface 410b face in opposite directions. The surface 411b and the surface 410a face each other. The surface 411b is not in contact with the surface 410a. That is, the first dummy pad 411 is not in contact with the dummy bump 410. For example, the distance between the surface 411b and the surface 410a is smaller than 1 μm. The surface 412b is in contact with the surface 410b.

The thickness of the bonding bump 310 is the distance between the surface 310a and the surface 310b. The thickness of the first bonding pad 311 is the distance between the surface 311a and the surface 311b. The thickness of the second bonding pad 312 is the distance between the surface 312a and the surface 312b. The thickness of the dummy bump 410 is the distance between the surface 410a and the surface 410b. The thickness of the first dummy pad 411 is the distance between the surface 411a and the surface 411b. The thickness of the second dummy pad 412 is the distance between the surface 412a and the surface 412b. For example, the thickness of each of the first bonding pad 311, the second bonding pad 312, the first dummy pad 411, and the second dummy pad 412 is smaller than 1 μm.

The sum of the thickness of the bonding bump 310 and the thickness of the first bonding pad 311 is larger than the sum of the thickness of the dummy bump 410 and the thickness of the first dummy pad 411. The sum of the thickness of the bonding bump 310, the thickness of the first bonding pad 311, and the thickness of the second bonding pad 312 is larger than the sum of the thickness of the dummy bump 410, the thickness of the first dummy pad 411, and the thickness of the second dummy pad 412.

The surface 312a is in contact with the first via 112. Thus, the bonding electrode 31 is electrically connected to the first wiring 111. The surface 311a is in contact with the second via 212. Thus, the bonding electrode 31 is electrically connected to the second wiring 211.

The surface 412a is not in contact with the first via 112. Thus, the dummy electrode 41 is electrically insulated from the first wiring 111. The surface 411b is not in contact with the surface 410a. Thus, the dummy electrode 41 is electrically insulated from the second wiring 211. The dummy electrode 41 may be electrically connected to only one of the first wiring 111 and the second wiring 211.

The thickness of the first dummy pad 411 may be the same as the thickness of the first bonding pad 311 and the thickness of the second dummy pad 412 may be smaller than the thickness of the second bonding pad 312. In this case, the surface 411b is in contact with the dummy bump 410 and the surface 410b is not in contact with the dummy bump 410.

An insulator such as a resin may be arranged between the first substrate 10 and the second substrate 20 to surround the bonding electrode 31 and the dummy electrode 41. At least a part between the surface 411b and the surface 410a, that is, at least a part between the first dummy pad 411 and the dummy bump 410, may be filled with an insulator such as a resin. At least a part between the surface 411b and the surface 410a, that is, at least a part between the first dummy pad 411 and the dummy bump 410, may be a space.

In terms of points other than the above, the configuration shown in FIG. 3 is similar to the configuration shown in FIG. 1.

In the semiconductor device 1b shown in FIG. 3, only the bonding electrode 31 is subjected to a load when application of the load is started to bond the first substrate 10 and the second substrate 20. Thus, an increase in the load necessary for bonding is suppressed. When a large load is applied, the bonding bump 310 is deformed. Thereby, the thickness of the bonding bump 310 is reduced. Thus, the surface 411b and the surface 410a may come into contact. That is, the first dummy pad 411 and the dummy bump 410 may be in contact with each other. When the first dummy pad 411 and the dummy bump 410 are in contact with each other, the first substrate 10 and the second substrate 20 are supported by the bonding electrode 31 and the dummy electrode 41. Therefore, deformation of the first substrate 10 and the second substrate 20 is suppressed.

The bonding electrode 31 and the dummy electrode 41 can be formed in the same process. Thus, a manufacturing process of the semiconductor device 1b can be simplified. In the manufacturing process of the semiconductor device 1b, the second bonding pad 312 and the second dummy pad 412 are simultaneously formed on the surface 110a through sputtering, vapor deposition, or the like. Thereafter, the bonding bump 310 and the dummy bump 410 are simultaneously formed. On the other hand, the first bonding pad 311 and the first dummy pad 411 are simultaneously formed on the surface 210a through sputtering, vapor deposition, or the like. Thereafter, in the bonding process, the bonding bump 310 and the first bonding pad 311 are connected, and the dummy bump 410 and the first dummy pad 411 are connected.

Figure 4:
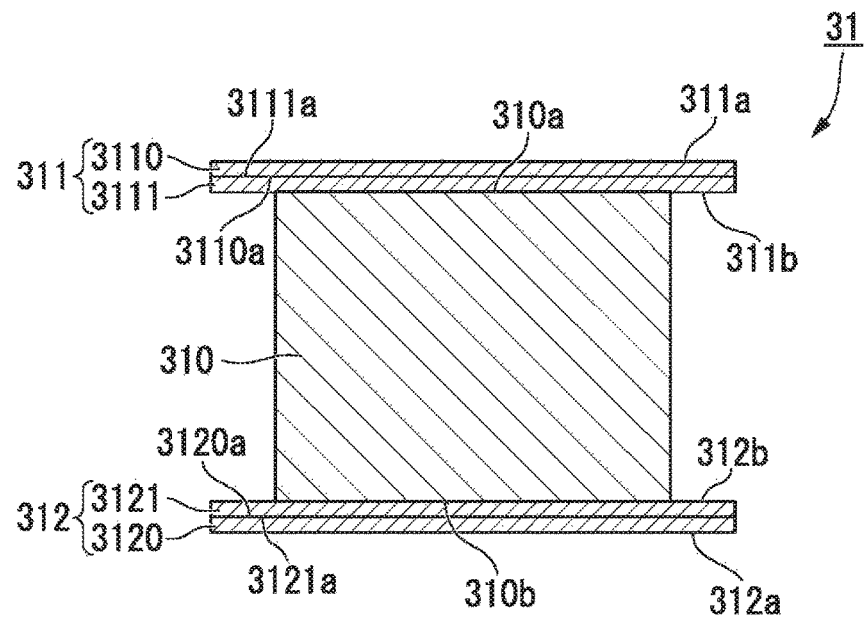
FIG. 4 is a cross-sectional view of a bonding electrode included in the semiconductor device according to the second embodiment of the present invention.

FIG. 4 shows the configuration of the bonding electrode 31. In FIG. 4, a cross section of the bonding electrode 31 is shown. As shown in FIG. 4, the bonding electrode 31 has a bonding bump 310, a first bonding pad 311, and a second bonding pad 312.

The dimensions of parts constituting the bonding electrode 31 are not subject to being dimensions shown in FIG. 4. The size of a part constituting the bonding electrode 31 is arbitrary. In FIG. 4, the thickness of the part constituting the bonding electrode 31 is indicated as the length of the part in a vertical direction.

The first bonding pad 311 includes a first barrier layer 3110 and a first bonding layer 3111. The first barrier layer 3110 and the first bonding layer 3111 are made of conductive materials. For example, the conductive materials constituting the first barrier layer 3110 are metals such as titanium (Ti) and tantalum (Ta). For example, conductive materials constituting the first bonding layer 3111 are metals such as gold (Au), aluminum (Al), and copper (Cu). The first barrier layer 3110 and the first bonding layer 3111 are stacked. The first barrier layer 3110 has a surface 311a (a third surface). The surface 311a is in contact with one of the surface 110a (the first surface) and the surface 210a (the second surface). In FIG. 3, the surface 311a is in contact with the surface 210a. The first bonding layer 3111 is stacked on the first barrier layer 3110. The first bonding layer 3111 has a surface 311b (a fourth surface). The surface 311b is in contact with the bonding bump 310. The thickness of the first dummy pad 411 is the same as the thickness of the first barrier layer 3110.

The first barrier layer 3110 further has a surface 3110a. The surface 311a and the surface 3110a face in opposite directions. The first bonding layer 3111 further has a surface 3111a. The surface 311b and the surface 3111a face in opposite directions. The surface 3111a is in contact with the surface 3110a.

The second bonding pad 312 has a second barrier layer 3120 and a second bonding layer 3121. The second barrier layer 3120 and the second bonding layer 3121 are made of conductive materials. For example, the conductive materials constituting the second barrier layer 3120 are metals such as titanium (Ti) and tantalum (Ta). For example, the conductive materials constituting the second bonding layer 3121 are metals such as gold (Au), aluminum (Al), and copper (Cu). The second barrier layer 3120 and the second bonding layer 3121 are stacked. The second barrier layer 3120 has a surface 312a (a seventh surface). The surface 312a is in contact with the surface 110a (the first surface) or the surface 210a (the second surface) which is not in contact with the surface 311a (the third surface). In FIG. 3, the surface 312a is in contact with the surface 110a. The second bonding layer 3121 is stacked on the second barrier layer 3120. The second bonding layer 3121 has a surface 312b (an eighth surface). The surface 312b is in contact with the bonding bump 310.

The second barrier layer 3120 further has a surface 3120a. The surface 312a and the surface 3120a face in opposite directions. The second bonding layer 3121 further has a surface 3121a. The surface 312b and the surface 3121a face in opposite directions. The surface 3121a is in contact with the surface 3120a.

Figure 5:
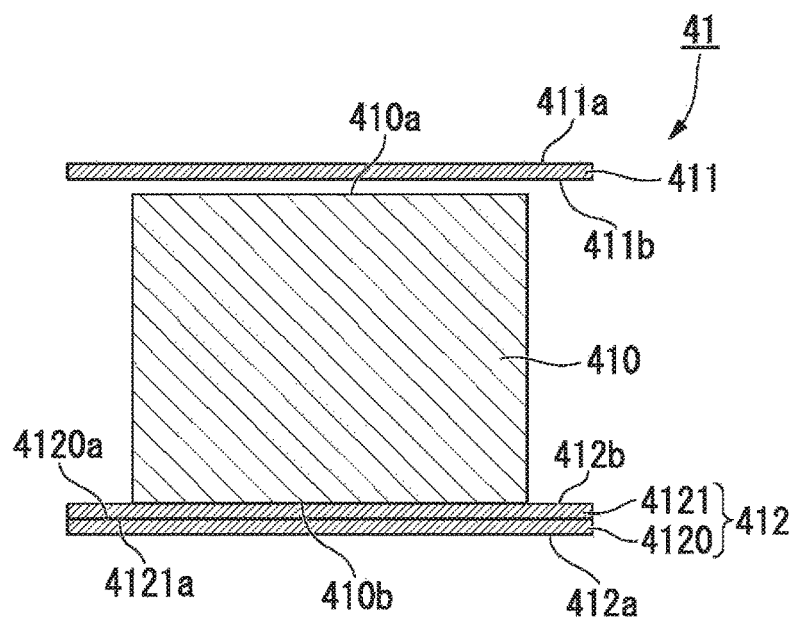
FIG. 5 is a cross-sectional view of a dummy electrode included in a semiconductor device according to a second embodiment of the present invention.

FIG. 5 shows the configuration of the dummy electrode 41. In FIG. 5, a cross section of the dummy electrode 41 is shown. As shown in FIG. 5, the dummy electrode 41 includes a dummy bump 410, a first dummy pad 411, and a second dummy pad 412.

The dimensions of parts constituting the dummy electrode 41 are not subject to being dimensions shown in FIG. 5. The dimensions of the parts constituting the dummy electrode 41 are arbitrary. In FIG. 5, the thickness of the part constituting the dummy electrode 41 is indicated as the length of the part in a vertical direction. For example, conductive materials constituting the first dummy pad 411 are metals such as titanium (Ti) and tantalum (Ta).

The second dummy pad 412 has a dummy barrier layer 4120 and a dummy bonding layer 4121. For example, conductive materials constituting the dummy barrier layer 4120 are metals such as titanium (Ti) and tantalum (Ta). For example, conductive materials constituting the dummy bonding layer 4121 are metals such as gold (Au), aluminum (Al), and copper (Cu). The dummy barrier layer 4120 and the dummy bonding layer 4121 are stacked. The dummy barrier layer 4120 has a surface 412a (a ninth surface). The surface 412a is in contact with of the surface 110a (the first surface) or the surface 210a (the second surface) which is not in contact with the surface 411a (the fifth surface). In FIG. 3, the surface 412a is in contact with the surface 110a. The dummy bonding layer 4121 is stacked on the dummy barrier layer 4120. The dummy bonding layer 4121 has a surface 412b (a tenth surface). The surface 412b is in contact with the dummy bump 410.

The dummy barrier layer 4120 further has a surface 4120a. The surface 412a and the surface 4120a face in opposite directions. The dummy bonding layer 4121 further has a surface 4121a. The surface 412b and the surface 4121a face in opposite directions. The surface 4121a is in contact with the surface 4120a.

The thickness of the dummy barrier layer 4120 is the same as the thickness of the second barrier layer 3120. The thickness of the dummy bonding layer 4121 is the same as the thickness of the second bonding layer 3121.

In a manufacturing process of the first bonding pad 311 and the first dummy pad 411, the first barrier layer 3110 and the first dummy pad 411 are simultaneously formed on the surface 210a. Thereafter, a first bonding layer 3111 is formed on the first barrier layer 3110.

The thickness of the first barrier layer 3110 is the distance between the surface 311a and the surface 3110a. The thickness of the first bonding layer 3111 is the distance between the surface 3111a and the surface 311b. The thickness of the dummy barrier layer 4120 is the distance between the surface 412a and the surface 4120a. The thickness of the dummy bonding layer 4121 is the distance between the surface 412b and the surface 4121a.

The sum of the thickness of the bonding bump 310, the thickness of the first barrier layer 3110, and the thickness of the first bonding layer 3111 is larger than the sum of the thickness of the dummy bump 410 and the thickness of the first dummy pad 411. The sum of the thickness of the bonding bump 310, the thickness of the first barrier layer 3110, the thickness of the first bonding layer 3111, the thickness of the second barrier layer 3120, and the thickness of the second bonding layer 3121 is larger than the sum of the thickness of the dummy bump 410, the thickness of the first dummy pad 411, the thickness of the dummy barrier layer 4120, and the thickness of the dummy bonding layer 4121.

In the semiconductor device of each aspect of the present invention, it is only necessary for one of the first condition in the first embodiment and the second condition in the second embodiment to be satisfied.

According to the second embodiment, the semiconductor device 1b is configured of the first substrate 10, the second substrate 20, the bonding electrode 31, and the dummy electrode 41.

In the second embodiment, only the bonding electrode 31 is subjected to a load when application of the load is started to bond the first substrate 10 and the second substrate 20. Thus, an increase in the load necessary for bonding is suppressed. When the bonding bump 310 is deformed at the time of bonding and the first dummy pad 411 and the dummy bump 410 are brought into contact with each other, the first substrate 10 and the second substrate 20 are supported by the bonding electrode 31 and the dummy electrode 41. Therefore, deformation of the first substrate 10 and the second substrate 20 is suppressed. The bonding electrode 31 and the dummy electrode 41 can be formed in the same process. Therefore, the manufacturing process of the semiconductor device 1b can be simplified.

Third Embodiment

Figure 6:
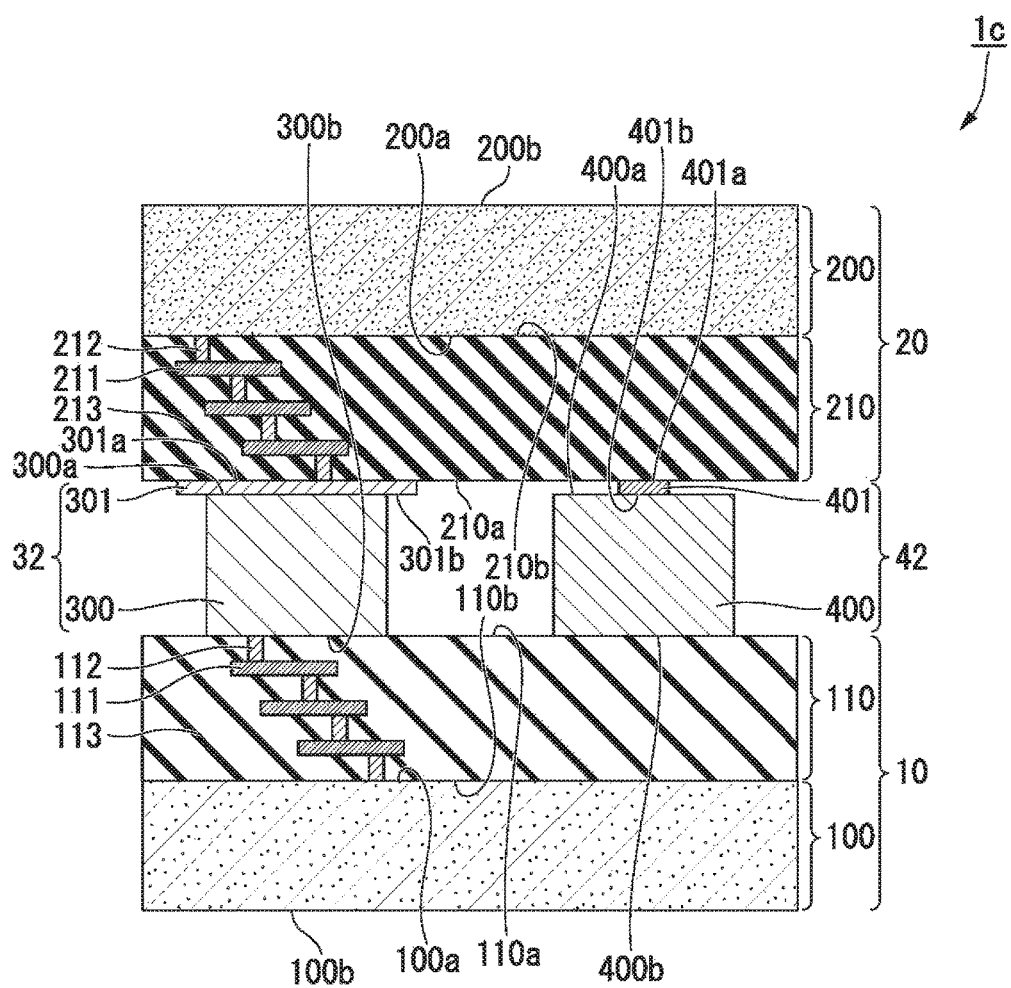
FIG. 6 is a cross-sectional view of a semiconductor device according to a third embodiment of the present invention.

FIG. 6 shows a configuration of a semiconductor device 1c according to the third embodiment of the present invention. In FIG. 6, a cross section of the semiconductor device 1c is shown. As shown in FIG. 6, the semiconductor device 1c includes a first substrate 10, a second substrate 20, a bonding electrode 32, and a dummy electrode 42. The first substrate 10 and the second substrate 20 are stacked via the bonding electrode 32 and the dummy electrode 42.

Dimensions of parts constituting the semiconductor device 1c are not subject to being dimensions shown in FIG. 6. The dimensions of the parts constituting the semiconductor device 1c are arbitrary. In FIG. 6, the thickness of the part constituting the semiconductor device 1c is indicated as a length of the part in a vertical direction.

Differences from the configuration shown in FIG. 1 will be described in terms of the configuration shown in FIG. 6.

In the semiconductor device 1c, the bonding electrode 30 shown in FIG. 1 is changed to the bonding electrode 32. Also, in the semiconductor device 1c, the dummy electrode 40 shown in FIG. 1 is changed to the dummy electrode 42. The bonding electrode 32 is arranged between a surface 110a (a first surface) and a surface 210a (a second surface). The bonding electrode 32 is electrically connected to the first wiring 111 and the second wiring 211. The dummy electrode 42 is arranged between the surface 110a and the surface 210a. The dummy electrode 42 is electrically insulated from at least one of the first wiring 111 and the second wiring 211.

The bonding electrode 32 has a bonding bump 300 and a first bonding pad 301. The bonding bump 300 is the same as the bonding bump 300 shown in FIG. 1. The first bonding pad 301 is the same as the first bonding pad 301 shown in FIG. 1. The surface 300b is in contact with the surface 110a. That is, the bonding bump 300 is in contact with the first substrate 10.

The first bonding pad 301 may be arranged between the bonding bump 300 and the first substrate 10. That is, the surface 301b may be in contact with the surface 110a and the surface 301a may be in contact with the bonding bump 300. The surface 300a may be in contact with the surface 210a. That is, the bonding bump 300 may be in contact with the second substrate 20.

The dummy electrode 42 includes a dummy bump 400 and a first dummy pad 401. The dummy bump 400 is the same as the dummy bump 400 shown in FIG. 1.

The first dummy pad 401 is the same as the first dummy pad 401 shown in FIG. 1. The surface 400b is in contact with the surface 110a. That is, the dummy bump 400 is in contact with the first substrate 10.

The first dummy pad 401 may be arranged between the dummy bump 400 and the first substrate 10. That is, the surface 401b may be in contact with the surface 110a and the surface 401a may be in contact with the dummy bump 400. The surface 400a may be in contact with the surface 210a. That is, the dummy bump 400 may be in contact with the second substrate 20.

An insulator such as a resin may be arranged between the first substrate 10 and the second substrate 20 to surround the bonding electrode 32 and the dummy electrode 42.

In terms of points other than the above, the configuration shown in FIG. 6 is similar to the configuration shown in FIG. 1.

According to the third embodiment, the semiconductor device 1c is configured of the first substrate 10, the second substrate 20, the bonding electrode 32, and the dummy electrode 42.

In the third embodiment, the first substrate 10 and the second substrate 20 are supported by the bonding electrode 32 and the dummy electrode 42 at the time of bonding. Therefore, deformation of the first substrate 10 and the second substrate 20 is suppressed. Also, because the area of the surface 401a is smaller than the area of the surface 301a, an increase in the load necessary for bonding is suppressed. The bonding electrode 32 and the dummy electrode 42 can be formed in the same process. Thus, a manufacturing process of the semiconductor device 1c can be simplified.

Fourth Embodiment

Figure 7:
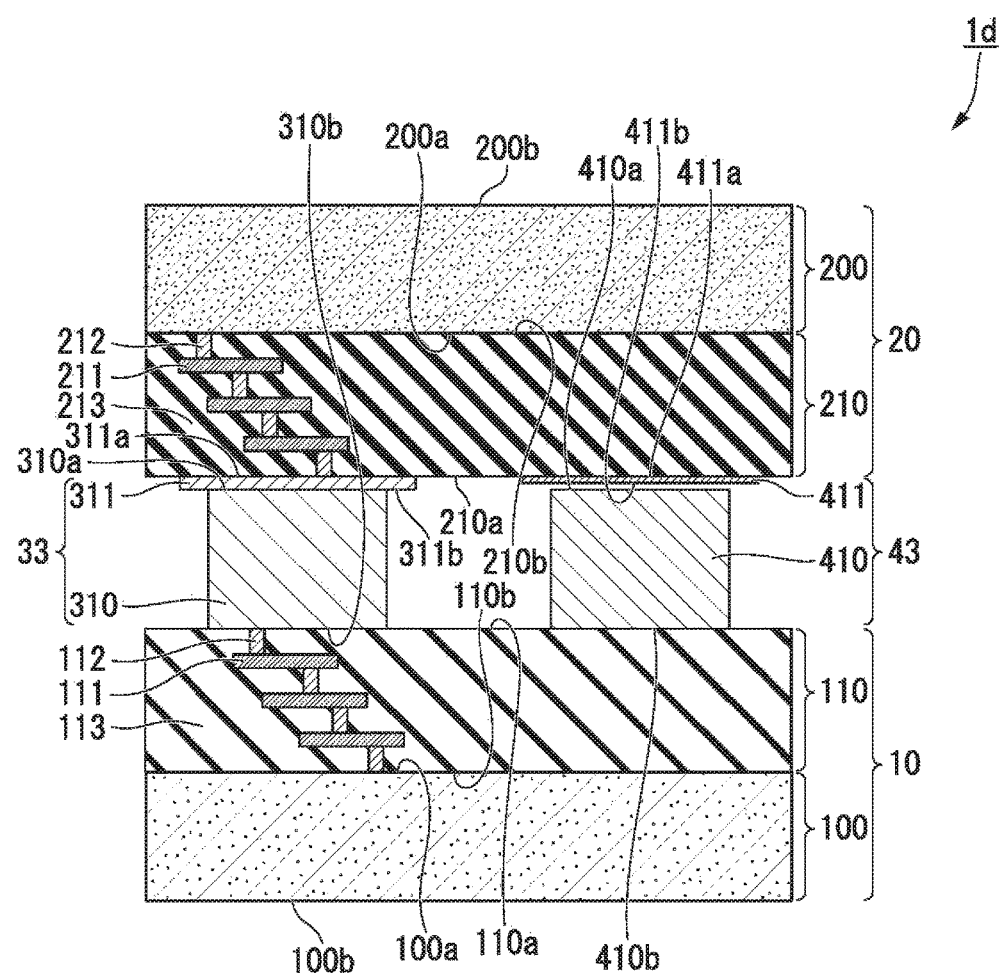
FIG. 7 is a cross-sectional view of a semiconductor device according to a fourth embodiment of the present invention.

FIG. 7 shows a configuration of a semiconductor device 1d according to the fourth embodiment of the present invention. In FIG. 7, a cross section of the semiconductor device 1d is shown. As shown in FIG. 7, the semiconductor device 1d includes a first substrate 10, a second substrate 20, a bonding electrode 33, and a dummy electrode 43. The first substrate 10 and the second substrate 20 are stacked via the bonding electrode 33 and the dummy electrode 43 therebetween.

Dimensions of parts constituting the semiconductor device 1d are not subject to being dimensions shown in FIG. 7. The dimensions of the parts constituting the semiconductor device 1d are arbitrary. In FIG. 7, the thickness of the part constituting the semiconductor device 1d is indicated as a length of the part in a vertical direction.

Differences from the configuration shown in FIG. 3 will be described in terms of the configuration shown in FIG. 7.

In the semiconductor device 1d, the bonding electrode 31 shown in FIG. 3 is changed to the bonding electrode 33. Also, in the semiconductor device 1d, the dummy electrode 41 shown in FIG. 3 is changed to the dummy electrode 43. The bonding electrode 33 is arranged between the surface 110a (a first surface) and the surface 210a (a second surface). The bonding electrode 33 is electrically connected to the first wiring 111 and the second wiring 211. The dummy electrode 43 is arranged between the surface 110a and the surface 210a. The dummy electrode 43 is electrically insulated from at least one of the first wiring 111 and the second wiring 211.

The bonding electrode 33 has a bonding bump 310 and a first bonding pad 311. The bonding bump 310 is the same as the bonding bumps 310 shown in FIGS. 3 and 4. The first bonding pad 311 is the same as the first bonding pads 311 shown in FIGS. 3 and 4. The surface 310b is in contact with the surface 110a. That is, the bonding bump 310 is in contact with the first substrate 10.

The dummy electrode 43 has a dummy bump 410 and a first dummy pad 411. The dummy bump 410 is the same as the dummy bumps 410 shown in FIGS. 3 and 5. The first dummy pad 411 is the same as the first dummy pads 411 shown in FIGS. 3 and 5. The surface 410b is in contact with the surface 110a. That is, the dummy bump 410 is in contact with the first substrate 10.

The first bonding pad 311 may be arranged between the bonding bump 310 and the first substrate 10. That is, the surface 311b may be in contact with the surface 110a and the surface 311a may be in contact with the bonding bump 310. The surface 310a may be in contact with the surface 210a. That is, the bonding bump 310 may be in contact with the second substrate 20.

An insulator such as a resin may be arranged between the first substrate 10 and the second substrate 20 to surround the bonding electrode 33 and the dummy electrode 43. At least a part between the surface 411b and the surface 410a, that is, at least a part between the first dummy pad 411 and the dummy bump 410, may be filled with an insulator such as a resin. At least a part between the surface 411b and the surface 410a, that is, at least a part between the first dummy pad 411 and the dummy bump 410, may be a space.

In terms of points other than the above, the configuration shown in FIG. 7 is similar to the configuration shown in FIG. 3.

According to the fourth embodiment, the semiconductor device 1d is configured of the first substrate 10, the second substrate 20, the bonding electrode 33, and the dummy electrode 43.

In the fourth embodiment, only the bonding electrode 33 is subjected to a load when application of the load is started to bond the first substrate 10 and the second substrate 20. Therefore, an increase in the load necessary for bonding is suppressed. When the bonding bump 310 is deformed at the time of bonding and the first dummy pad 411 and the dummy bump 410 are brought into contact with each other, the first substrate 10 and the second substrate 20 are supported by the bonding electrode 33 and the dummy electrode 43. Therefore, deformation of the first substrate 10 and the second substrate 20 is suppressed. The bonding electrode 33 and the dummy electrode 43 can be formed in the same process. Therefore, a manufacturing process of the semiconductor device 1d can be simplified.

Fifth Embodiment

Figure 8:
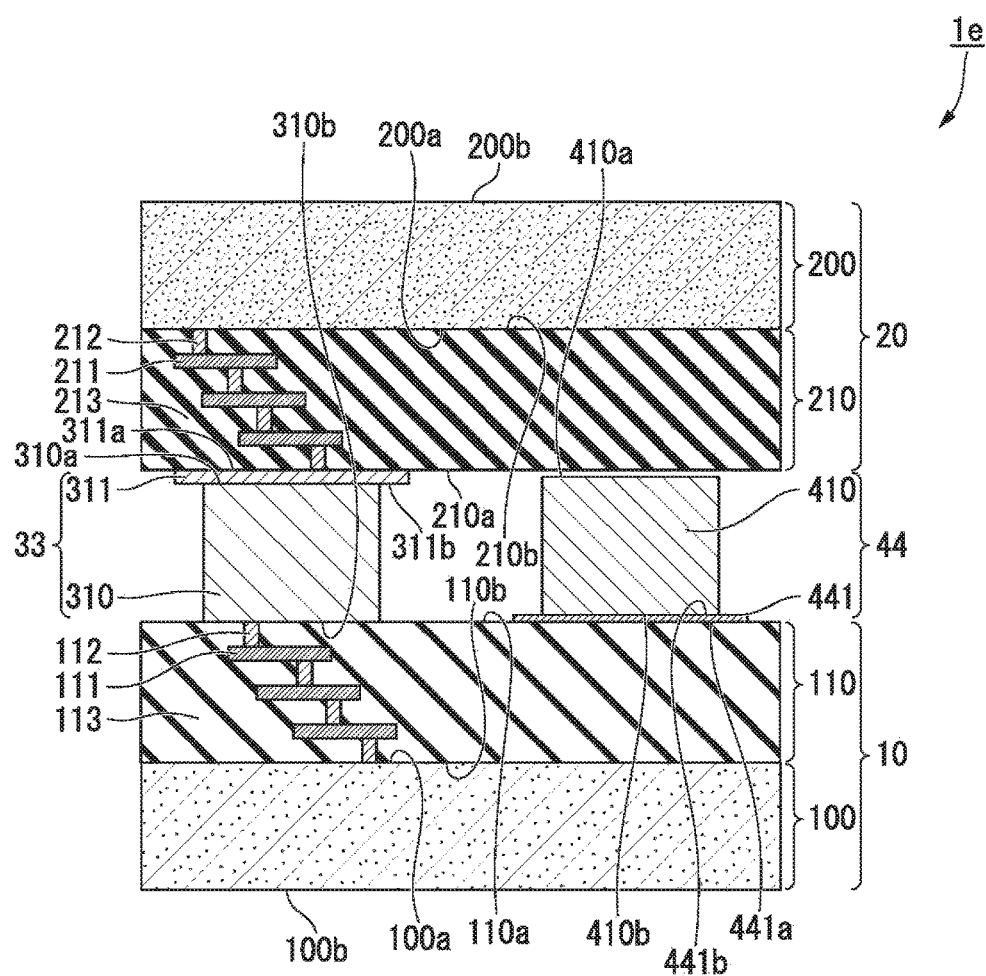
FIG. 8 is a cross-sectional view of a semiconductor device according to a fifth embodiment of the present invention.
Figure 9:
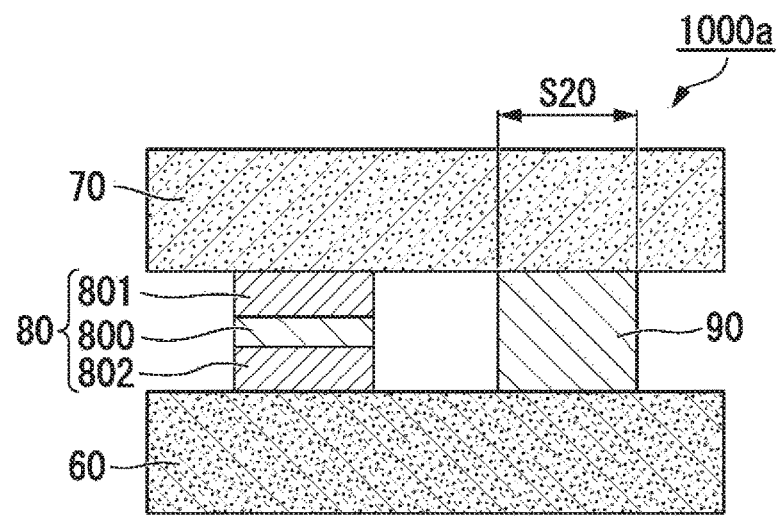
FIG. 9 is a cross-sectional view showing a configuration of a semiconductor device of conventional technology.
Figure 10:
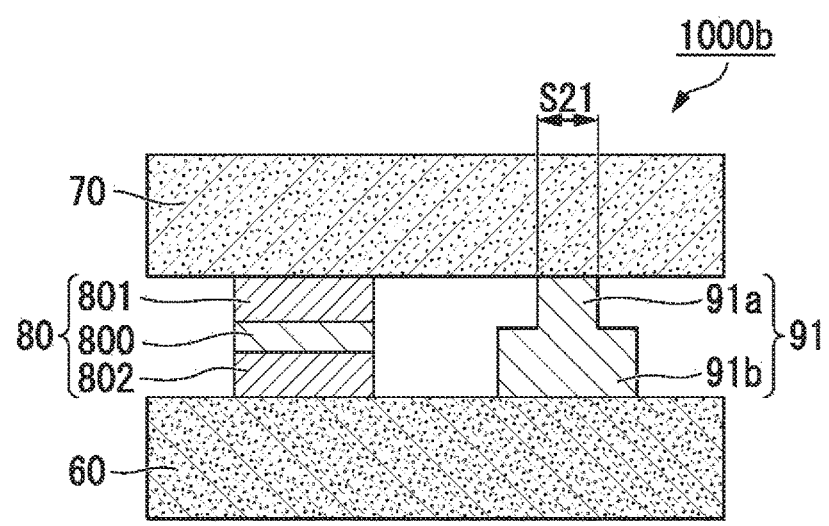
FIG. 10 is a cross-sectional view showing a configuration of a semiconductor device of conventional technology.

FIG. 8 shows a configuration of a semiconductor device 1e according to a fifth embodiment of the present invention. In FIG. 8, a cross section of the semiconductor device 1e is shown. As shown in FIG. 8, the semiconductor device 1e includes a first substrate 10, a second substrate 20, a bonding electrode 33, and a dummy electrode 44. The first substrate 10 and the second substrate 20 are stacked via the bonding electrode 33 and the dummy electrode 44 therebetween.

Dimensions of parts constituting the semiconductor device 1e are not subject to being dimensions shown in FIG. 8. The dimensions of the parts constituting the semiconductor device 1e are arbitrary. In FIG. 8, the thickness of the part constituting the semiconductor device 1e is indicated as a length of the part in a vertical direction.

Differences from the configuration shown in FIG. 3 will be described in terms of the configuration shown in FIG. 8.

The bonding electrode 33 is the same as the bonding electrode 33 shown in FIG. 7. The dummy electrode 44 is arranged between the surface 110a (a first surface) and the surface 210a (a second surface). The dummy electrode 44 is electrically insulated from at least one of the first wiring 111 and the second wiring 211.

A first bonding pad 311 may be arranged between the bonding bump 310 and the first substrate 10. That is, the surface 311b may be in contact with the surface 110a and the surface 311a may be in contact with the bonding bump 310. The surface 310a may be in contact with the surface 210a. That is, the bonding bump 310 may be in contact with the second substrate 20.

The dummy electrode 44 has a dummy bump 410 and a first dummy pad 441. The dummy bump 410 is the same as the dummy bumps 410 shown in FIGS. 3 and 5. For example, the first dummy pad 441 is configured to be the same as the dummy barrier layer 4120 shown in FIG. 5. The first dummy pad 441 has a surface 441a (a fifth surface) and a surface 441b (a sixth surface). The surface 441a and the surface 441b face in opposite directions. The surface 441a is in contact with one of the surface 110a (the first surface) and the surface 210a (the second surface). In FIG. 8, the surface 441a is in contact with the surface 110a. The surface 441b is in contact with the dummy bump 410.

Because the first dummy pad 441 is arranged, it is difficult for the metal constituting the dummy bump 410 to diffuse into the first wiring layer 110 at the time of bonding. Therefore, a change in electrical characteristics of the semiconductor device 1e due to the diffusion of the metal constituting the dummy bump 410 into the first wiring layer 110 at the time of bonding is suppressed.

The surface 410a and the surface 210a face each other. The surface 410a is not in contact with the surface 210a. That is, the dummy bump 410 is not in contact with the first substrate 10 and the second substrate 20. For example, the distance between the surface 410a and the surface 210a is smaller than 1 µm.

The thickness of the first dummy pad 441 is the distance between the surface 441a and the surface 441b. For example, the thickness of the first dummy pad 441 is smaller than 1 µm.

The sum of the thickness of the bonding bump 310 and the thickness of the first bonding pad 311 is larger than the sum of the thickness of the dummy bump 410 and the thickness of the first dummy pad 441.

The surface 441a is not in contact with the first via 112. Therefore, the dummy electrode 44 is electrically insulated from first wiring 111. The surface 410a is not in contact with the surface 210a. Thus, the dummy electrode 44 is electrically insulated from second wiring 211. The dummy electrode 44 may be electrically connected to only one of the first wiring 111 and the second wiring 211.

An insulator such as a resin may be arranged between the first substrate 10 and the second substrate 20 to surround the bonding electrode 33 and the dummy electrode 44. At least a part between the surface 210a and the surface 410a, that is, at least a part between the second substrate 20 and the dummy bump 410, may be filled with an insulator such as a resin. At least a part between the surface 210a and the surface 410a, that is, at least a part between the second substrate 20 and the dummy bump 410, may be a space.

In terms of points other than the above, the configuration shown in FIG. 8 is similar to the configuration shown in FIG. 3.

The bonding electrode 33 and the dummy electrode 44 can be formed in the same process. In a manufacturing process of the semiconductor device 1e, the first dummy pad 441 is formed on the surface 110a through sputtering, vapor deposition, or the like. Thereafter, the bonding bump 310 and the dummy bump 410 are simultaneously formed. On the other hand, the first bonding pad 311 is formed on the surface 210a through sputtering, vapor deposition, or the like. Thereafter, in the bonding process, the bonding bump 310 and the first bonding pad 311 are connected.

According to the fifth embodiment, the semiconductor device 1e is configured of the first substrate 10, the second substrate 20, the bonding electrode 33, and the dummy electrode 44.

In the fifth embodiment, only the bonding electrode 33 is subjected to a load when application of the load is started to bond the first substrate 10 and the second substrate 20. Therefore, an increase in the load necessary for bonding is suppressed. When the bonding bump 310 is deformed at the time of bonding and the second substrate 20 and the dummy bump 410 are brought into contact with each other, the first substrate 10 and the second substrate 20 are supported by the bonding electrode 33 and the dummy electrode 44. Therefore, deformation of the first substrate 10 and the second substrate 20 is suppressed. The bonding electrode 33 and the dummy electrode 44 can be formed in the same process. Thus, the manufacturing process of the semiconductor device 1e can be simplified.

While preferred embodiments of the invention have been described and shown above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:
1. A semiconductor device comprising:
a first semiconductor substrate having a first surface and a first wiring and containing a first semiconductor material;
a second semiconductor substrate having a second surface and a second wiring and containing a second semiconductor material, wherein the first surface and the second surface face each other;
a bonding electrode arranged between the first surface and the second surface and electrically connected to the first wiring and the second wiring; and a dummy electrode arranged between the first surface and the second surface and electrically insulated from at least one of the first wiring and the second wiring;
wherein the bonding electrode includes:
a bonding bump; and
a first bonding pad having a third surface and a fourth surface, wherein the third surface is in contact with one of the first surface and the second surface and the fourth surface is in contact with the bonding bump;
wherein the dummy electrode includes:
a dummy bump; and
a first dummy pad having a fifth surface and a sixth surface, wherein the fifth surface is in contact with one of the first surface and the second surface;
wherein the thickness of the dummy bump is the same as the thickness of the bonding bump;
wherein one of a first condition and a second condition is satisfied;
wherein the sixth surface is in contact with the dummy bump under the first condition;
wherein an area of the fifth surface is smaller than an area of the third surface under the first condition;
wherein the thickness of the first dummy pad is the same as the thickness of the first bonding pad under the first condition; and
wherein the thickness of the first dummy pad is smaller than the thickness of the first bonding pad under the second condition.

2. The semiconductor device according to claim 1,
wherein the bonding electrode further includes a second bonding pad;
wherein the second bonding pad has a seventh surface and an eighth surface, the seventh surface is in contact with the first surface or the second surface which is not in contact with the third surface, and the eighth surface is in contact with the bonding bump;
wherein the dummy electrode further includes a second dummy pad;
wherein the second dummy pad has a ninth surface and a tenth surface, the ninth surface is in contact with the first surface or the second surface which is not in contact with the fifth surface, and the tenth surface is in contact with the dummy bump; and
wherein the thickness of the second dummy pad is the same as the thickness of the second bonding pad and the first condition is satisfied.

3. The semiconductor device according to claim 1,
wherein the first bonding pad includes:
a first barrier layer having the third surface, wherein the third surface is in contact with one of the first surface and the second surface; and
a first bonding layer stacked on the first barrier layer and having the fourth surface, wherein the fourth surface is in contact with the bonding bump;
and
wherein the thickness of the first dummy pad is the same as the thickness of the first barrier layer and the second condition is satisfied.

4. The semiconductor device according to claim 3,
wherein the bonding electrode further includes a second bonding pad;
wherein the second bonding pad includes:
a second barrier layer having a seventh surface, wherein the seventh surface is in contact with the first surface or the second surface which is not in contact with the third surface; and
a second bonding layer stacked on the second barrier layer and having an eighth surface, wherein the eighth surface is in contact with the bonding bump;
wherein the dummy electrode further includes a second dummy pad;
wherein the second dummy pad includes:
a dummy barrier layer having a ninth surface, wherein the ninth surface is in contact with the first surface or the second surface which is not in contact with the fifth surface; and
a dummy bonding layer stacked on the dummy barrier layer and having a tenth surface, wherein the tenth surface is in contact with the dummy bump;
wherein the thickness of the dummy barrier layer is the same as the thickness of the second barrier layer; and
wherein the thickness of the dummy bonding layer is the same as the thickness of the second bonding layer.

* * * * *